(12) United States Patent
Sutardja

(10) Patent No.: US 8,868,879 B2
(45) Date of Patent: *Oct. 21, 2014

(54) SYSTEM ON CHIP WITH RECONFIGURABLE SRAM

(71) Applicant: Marvell World Trade Ltd., St. Michael (BB)

(72) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/971,054

(22) Filed: Aug. 20, 2013

(65) Prior Publication Data

US 2013/0339588 A1 Dec. 19, 2013

Related U.S. Application Data

(63) Continuation of application No. 13/709,980, filed on Dec. 10, 2012, now Pat. No. 8,516,216, which is a continuation of application No. 12/100,107, filed on Apr. 9, 2008, now Pat. No. 8,332,610.

(60) Provisional application No. 60/912,252, filed on Apr. 17, 2007, provisional application No. 61/033,843, filed on Mar. 5, 2008.

(51) Int. Cl.
| | |
|---|---|
| *G06F 13/00* | (2006.01) |
| *G11C 7/10* | (2006.01) |
| *G06F 12/00* | (2006.01) |
| *G06F 12/02* | (2006.01) |
| *G06F 15/78* | (2006.01) |
| *G06F 12/06* | (2006.01) |

(52) U.S. Cl.
CPC ............. *G11C 7/1072* (2013.01); *G06F 12/00* (2013.01); *G06F 12/0246* (2013.01); *G06F 15/7842* (2013.01); *G06F 12/0646* (2013.01)
USPC .................................. 711/170; 711/E12.064

(58) Field of Classification Search
None
See application file for complete search history.

(56) References Cited

U.S. PATENT DOCUMENTS

| | | | |
|---|---|---|---|
| 5,506,994 A | 4/1996 | Sugita | |
| 5,619,676 A | 4/1997 | Fukuda et al. | |

(Continued)

FOREIGN PATENT DOCUMENTS

EP 0 927 936 A2 7/1999

OTHER PUBLICATIONS

Notification of Transmittal of the International Search Report and The Written Opinion of The International Searching Authority, or the Declaration dated Sep. 2, 2008 in reference to PCT/US2008/004959.

(Continued)

*Primary Examiner* — Sean D Rossiter

(57) ABSTRACT

A system on chip includes a random access memory, a read-only memory, and a processor. The processor is configured to, during a development phase of the system on chip, read program code from the random access memory and execute the program code. The program code is developed during the development phase until a completed version of the program code is reached. The processor is configured to, during an operational phase of the system on chip, (i) read the completed version from the read-only memory, (ii) execute the completed version, and (iii) cache data in the random access memory. The processor is configured to, during the operational phase and in response to an improvement to the completed version of the program code being developed, (i) read program code corresponding to the improvement from the random access memory, and (ii) read remaining portions of the completed version from the read-only memory.

22 Claims, 6 Drawing Sheets

(56) References Cited

U.S. PATENT DOCUMENTS

| | | | |
|---|---|---|---|
| 5,933,855 A | 8/1999 | Rubinstein | |
| 6,195,733 B1 | 2/2001 | Nair et al. | |
| 6,282,647 B1 * | 8/2001 | Leung et al. | 713/100 |
| 6,304,950 B1 | 10/2001 | Inoue et al. | |
| 6,492,833 B1 | 12/2002 | Asson et al. | |
| 6,714,041 B1 * | 3/2004 | Darling et al. | 326/38 |
| 7,162,578 B2 * | 1/2007 | Bruner et al. | 711/112 |
| 7,607,005 B1 | 10/2009 | Lewis | |
| 2003/0212853 A1 | 11/2003 | Huppenthal et al. | |
| 2004/0030844 A1 | 2/2004 | Tojima et al. | |
| 2004/0109451 A1 | 6/2004 | Huang et al. | |
| 2004/0260884 A1 | 12/2004 | Poznanovic et al. | |
| 2005/0041149 A1 | 2/2005 | Chan et al. | |
| 2005/0071574 A1 | 3/2005 | Frenzel et al. | |
| 2005/0125779 A1 * | 6/2005 | Kelley et al. | 717/138 |
| 2006/0012395 A1 | 1/2006 | Huppenthal et al. | |
| 2007/0011431 A1 | 1/2007 | Hogdal et al. | |

OTHER PUBLICATIONS

G. Uvieghara, A Highly-Integrated 3G CDMA2000 1 X Cellular Baseband Chip With GSM/AMPS/GPS/Bluetooth/Multimedia Capabilities and ZIF RF Support, 2004, IEEE, ISSCC 2004 / Session 23 / Channel Coding / 23.3.

* cited by examiner

200
SYSTEM ON CHIP WITH RECONFIGURABLE SRAM

CROSS-REFERENCE TO RELATED APPLICATIONS

This is a continuation of U.S. patent application Ser. No. 13/709,980 (now U.S. Pat. No. 8,516,216), filed on Dec. 10, 2012, which is a continuation of U.S. patent application Ser. No. 12/100,107 (now U.S. Pat. No. 8,332,610), filed on Apr. 9, 2008, which claims the benefit of U.S. Provisional Application No. 60/912,252, filed on Apr. 17, 2007 and U.S. Provisional Application No. 61/033,843, filed on Mar. 5, 2008. The entire disclosures of the above referenced applications are incorporated herein by reference.

FIELD

The present disclosure relates to static random access memory (SRAM), and more particularly to systems on chip with reconfigurable SRAM.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a functional block diagram of an exemplary system on chip (SoC) 202 is shown. For example only, the SoC 202 may be used for a third generation (3G) mobile communications device or any other computing device. The SoC 202 includes a processor 204 that executes software. For example, the processor 204 may execute the operating system for the SoC 202, the user interface for the SoC 202, and user programs, such as a web browser.

The processor 204 may execute code out of a read-only memory (ROM) 206, nonvolatile storage 208, and/or memory 210. The ROM 206 may be used to store the operating system and user interface. Nonvolatile storage 208 may be used to store user programs, such as a web browser. Memory 210 may be used to cache data from nonvolatile storage 208.

Memory 210 and nonvolatile storage 208 may be external to the SoC 202 and may communicate with the processor 204 via a bridge controller 212. Data from the bridge controller 212 may be cached in a level 1 (L1) static random access memory (SRAM) cache 220 and a level 2 (L2) SRAM cache 222. The processor 204 may communicate with a general digital signal processor (DSP) 224. In various implementations, the general DSP 224 may perform tasks such as audio and video compression and decompression. The general DSP may store data upon which the general DSP 224 is operated in a DSP SRAM 226.

The processor 204 may communicate with a video accelerator 230 that performs graphic operations used for displaying graphics, text, and video. The video accelerator 230 may store data, such as video frames, in a scratch pad SRAM 232. The processor 204 may establish network communication, whether wired or wireless. The processor 204 may communicate with a protocol stack processor 240, which handles layers of the protocol stack, such as the network layer and transport layer.

The protocol stack processor 240 may store packets and state variables in on-chip SRAM, such as a scratch pad SRAM 242, or in nonvolatile storage 244, which may be external to the SoC 202. Data from nonvolatile storage 244 may be cached in an L1 SRAM 246. The protocol stack processor 240 may pass raw data to a baseband DSP 250. The baseband DSP 250 may store temporary data in a DSP SRAM 252. The baseband DSP 250 may provide binary data to an RF module 254 for transmission via an antenna 256. Similarly, the RF module 254 may transmit data from the antenna 256 to the baseband DSP 250.

As can be appreciated, the layout of blocks of SRAM with respect to memory-using components of the SoC are determined in advance and cannot be readily changed after manufacturing. The performance demands on the blocks of SRAM may change during the life of the SoC. In addition, different purchasers of first and second SoCs having the same common components may have different performance objectives that require different amounts of SRAM. Therefore, different SoCs need to be designed and manufactured, which is costly.

SUMMARY

A system on chip comprises N components, where N is an integer greater than one, and a storage module. The storage module comprises a first memory, a control module, and a connection module. The first memory includes M blocks of static random access memory, where M is an integer greater than one. The control module generates a first assignment of the M blocks to the N components during a first period and generates a second assignment of the M blocks to the N components during a second period. The first and second assignments are different. The connection module dynamically connects the M blocks to the N components based on the first and second assignments.

At least one of the N components comprises a processor. The control module adjusts assignment of ones of the M blocks assigned as cache for the processor and as temporary storage for the processor. At least one of the N components comprises a secondary processor. The control module adjusts assignment of ones of the M blocks assigned as cache for the secondary processor and as temporary storage for the secondary processor.

At least one of the N components comprises a digital signal processor. The control module adjusts assignment of ones of the M blocks assigned as cache for the digital signal processor and as temporary storage for the digital signal processor. The N components comprise a processor, a secondary processor, and a digital signal processor. The connection module adjusts assignment of the M blocks to the processor, the secondary processor, and the digital signal processor based on the first and second assignments.

The system on chip further comprises a second memory; and a memory interface that selectively accesses data from one of the second memory and the storage module based on an access request from one of the N components. The second memory comprises read-only memory. The second memory comprises mask read-only memory. The second memory comprises flash memory. The control module assigns ones of the M blocks to emulate read-only memory during a development phase, and assigns the ones of the M blocks as cache during an operational phase.

The system on chip further comprises read-only memory. The control module assigns at least one of the M blocks to emulate a portion of the read-only memory. The N components comprise at least two of a processor, a secondary processor, a baseband processor, a video accelerator, and a digital signal processor. The connection module adjusts assignment of the M blocks to the at least two of the processor, the secondary processor, the baseband processor, the video accelerator, and the digital signal processor.

A system on chip comprises N components integrated within the system on chip, where N is an integer greater than one, and a storage module integrated within the system on chip. The storage module comprises a first memory, a control module, and a connection module. The first memory includes M blocks of static random access memory, where M is an integer greater than one. The control module dynamically generates an assignment of the M blocks to the N components. The connection module dynamically connects the M blocks to the N components based on the assignment.

At least one of the N components comprises a processor. The control module adjusts assignment of ones of the M blocks assigned as cache for the processor and as temporary storage for the processor. At least one of the N components comprises a secondary processor. The control module adjusts assignment of ones of the M blocks assigned as cache for the secondary processor and as temporary storage for the secondary processor. At least one of the N components comprises a digital signal processor. The control module adjusts assignment of ones of the M blocks assigned as cache for the digital signal processor and as temporary storage for the digital signal processor.

The N components comprise a processor, a secondary processor, and a digital signal processor. The connection module adjusts the assignment of the M blocks to the processor, the secondary processor, and the digital signal processor. The system on chip further comprises a second memory; and a memory interface that selectively accesses data from one of the second memory and the storage module based on an access request from one of the N components. The second memory comprises read-only memory. The second memory comprises mask read-only memory. The second memory comprises flash memory.

The control module assigns ones of the M blocks to emulate read-only memory during a development phase, and assigns the ones of the M blocks as cache during an operational phase. The system on chip further comprises read-only memory. The control module assigns at least one of the M blocks to emulate a portion of the read-only memory. The N components comprise at least two of a processor, a secondary processor, a baseband processor, a video accelerator, and a digital signal processor. The connection module adjusts the assignment of the M blocks to the at least two of the processor, the secondary processor, the baseband processor, the video accelerator, and the digital signal processor.

A system on chip comprises N components, where N is an integer greater than one, and a storage module. The storage module comprises a first memory, control means, and connection means. The first memory includes M blocks of static random access memory, where M is an integer greater than one. The control means is for generating a first assignment of the M blocks to the N components during a first period and for generating a second assignment of the M blocks to the N components during a second period. The first and second assignments are different. The connection means is for dynamically connecting the M blocks to the N components based on the first and second assignments.

At least one of the N components comprises a processor. The control means adjusts assignment of ones of the M blocks assigned as cache for the processor and as temporary storage for the processor. At least one of the N components comprises a secondary processor. The control means adjusts assignment of ones of the M blocks assigned as cache for the secondary processor and as temporary storage for the secondary processor. At least one of the N components comprises a digital signal processor. The control means adjusts assignment of ones of the M blocks assigned as cache for the digital signal processor and as temporary storage for the digital signal processor.

The N components comprise a processor, a secondary processor, and a digital signal processor. The connection means adjusts assignment of the M blocks to the processor, the secondary processor, and the digital signal processor based on the first and second assignments. The system on chip further comprises a second memory; and memory interfacing means for selectively accessing data from one of the second memory and the storage module based on an access request from one of the N components. The second memory comprises read-only memory. The second memory comprises mask read-only memory. The second memory comprises flash memory.

The control means assigns ones of the M blocks to emulate read-only memory during a development phase, and assigns the ones of the M blocks as cache during an operational phase. The system on chip further comprises read-only memory. The control means assigns at least one of the M blocks to emulate a portion of the read-only memory. The N components comprise at least two of a processor, a secondary processor, a baseband processor, a video accelerator, and a digital signal processor. The connection means adjusts assignment of the M blocks to the at least two of the processor, the secondary processor, the baseband processor, the video accelerator, and the digital signal processor.

A system on chip comprises N components, where N is an integer greater than one, and a storage module. The storage module comprises a first memory, control means, and connection means. The first memory includes M blocks of static random access memory, where M is an integer greater than one. The control means is for dynamically generating an assignment of the M blocks to the N components. The connection means is for dynamically connecting the M blocks to the N components based on the assignment.

At least one of the N components comprises a processor. The control means adjusts assignment of ones of the M blocks assigned as cache for the processor and as temporary storage for the processor. At least one of the N components comprises a secondary processor. The control means adjusts assignment of ones of the M blocks assigned as cache for the secondary processor and as temporary storage for the secondary processor. At least one of the N components comprises a digital signal processor. The control means adjusts assignment of ones of the M blocks assigned as cache for the digital signal processor and as temporary storage for the digital signal processor.

The N components comprise a processor, a secondary processor, and a digital signal processor. The connection means adjusts the assignment of the M blocks to the processor, the secondary processor, and the digital signal processor. The system on chip further comprises a second memory; and memory interfacing means for selectively accessing data from one of the second memory and the storage module based on an access request from one of the N components. The second memory comprises read-only memory. The second memory comprises mask read-only memory. The second memory comprises flash memory.

The control means assigns ones of the M blocks to emulate read-only memory during a development phase, and assigns the ones of the M blocks as cache during an operational phase. The system on chip further comprises read-only memory. The control means assigns at least one of the M blocks to emulate a portion of the read-only memory. The N components comprise at least two of a processor, a secondary processor, a baseband processor, a video accelerator, and a digital signal processor. The connection means adjusts the assignment of the M blocks to the at least two of the processor, the secondary processor, the baseband processor, the video accelerator, and the digital signal processor.

A method comprises providing N components, where N is an integer greater than one, and providing a first memory including M blocks of static random access memory, where M is an integer greater than one. The method further comprising generating a first assignment of the M blocks to the N components during a first period, generating a second assignment of the M blocks to the N components during a second period, and dynamically connecting the M blocks to the N components based on the first and second assignments. The first and second assignments are different.

At least one of the N components comprises a processor and the method further comprises adjusting assignment of ones of the M blocks assigned as cache for the processor and as temporary storage for the processor. At least one of the N components comprises a secondary processor and the method further comprises adjusting assignment of ones of the M blocks assigned as cache for the secondary processor and as temporary storage for the secondary processor.

At least one of the N components comprises a digital signal processor and further comprises adjusting assignment of ones of the M blocks assigned as cache for the digital signal processor and as temporary storage for the digital signal processor. The N components comprise a processor, a secondary processor, and a digital signal processor, and the method further comprises adjusting assignment of the M blocks to the processor, the secondary processor, and the digital signal processor based on the first and second assignments.

The method further comprises providing a second memory and selectively accessing data from one of the first and second memories based on an access request from one of the N components. The second memory comprises read-only memory. The second memory comprises mask read-only memory. The second memory comprises flash memory. The method further comprises assigning ones of the M blocks to emulate read-only memory during a development phase; and assigning the ones of the M blocks as cache during an operational phase.

The method further comprises providing read-only memory and assigning at least one of the M blocks to emulate a portion of the read-only memory. The N components comprise at least two of a processor, a secondary processor, a baseband processor, a video accelerator, and a digital signal processor, and the method further comprises adjusting assignment of the M blocks to the at least two of the processor, the secondary processor, the baseband processor, the video accelerator, and the digital signal processor.

A method comprises providing N components integrated within a system on chip, where N is an integer greater than one; providing a first memory that is integrated within said system on chip and that includes M blocks of static random access memory, where M is an integer greater than one; dynamically generating an assignment of the M blocks to the N components; and dynamically connecting the M blocks to the N components based on the assignment.

At least one of the N components comprises a processor and the method further comprises adjusting assignment of ones of the M blocks assigned as cache for the processor and as temporary storage for the processor. At least one of the N components comprises a secondary processor and the method further comprises adjusting assignment of ones of the M blocks assigned as cache for the secondary processor and as temporary storage for the secondary processor.

At least one of the N components comprises a digital signal processor and further comprises adjusting assignment of ones of the M blocks assigned as cache for the digital signal processor and as temporary storage for the digital signal processor. The N components comprise a processor, a secondary processor, and a digital signal processor, and the method further comprises adjusting the assignment of the M blocks to the processor, the secondary processor, and the digital signal processor.

The method further comprises providing a second memory and selectively accessing data from one of the first and second memories based on an access request from one of the N components. The second memory comprises read-only memory. The second memory comprises mask read-only memory. The second memory comprises flash memory. The method further comprises assigning ones of the M blocks to emulate read-only memory during a development phase and assigning the ones of the M blocks as cache during an operational phase.

The method further comprises providing read-only memory and assigning at least one of the M blocks to emulate a portion of the read-only memory. The N components comprise at least two of a processor, a secondary processor, a baseband processor, a video accelerator, and a digital signal processor, and the method further comprises adjusting the assignment of the M blocks to the at least two of the processor, the secondary processor, the baseband processor, the video accelerator, and the digital signal processor.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
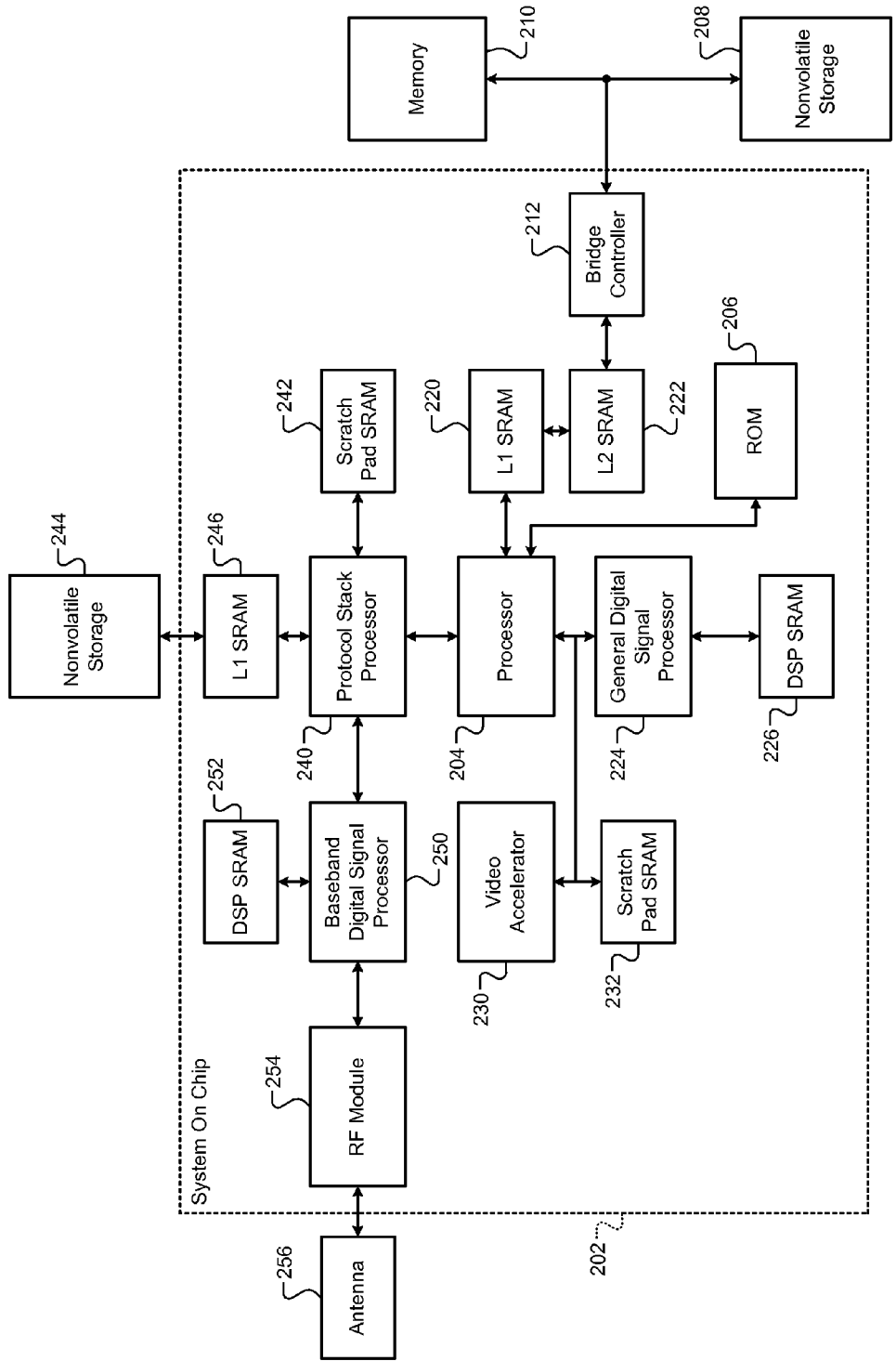
FIG. 1 is a functional block diagram of an exemplary system on chip (SoC) according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Systems on chip (SoCs) often include multiple volatile memories, such as static random access memories (SRAMs). For example, an SRAM may be included as a scratch pad for storing temporary values. SRAMs may be used to cache instructions and data for a processor, such as when the SRAM is used as a level 1 (L1) or level 2 (L2) cache. Multiple SRAMs may be included for components of the SoC and/or blocks of one SRAM may be assigned to two or more components before manufacturing.

In addition, SRAMs may be used to store data that is being operated on by a digital signal processor (DSP). Multiple DSPs may each be assigned their own SRAM. Typically, the blocks of SRAM are assigned during manufacturing to perform a particular function for a particular component of the SoC.

Size requirements for each SRAM may vary depending upon application. For example, in one application, the amount of data operated on by the DSP may be smaller, requiring a smaller SRAM for that application. Similarly, different sizes of cache may have a greater or lesser effect on performance depending upon the application being run.

Further, at different times during the development cycle, various sizes of SRAM may have certain advantages. For example, during development and debugging, performance increases resulting from cache may not be a high priority. Instead, more memory may be useful for DSP storage until the processing algorithms are tailored to be more space efficient.

In addition, an SRAM may be allocated to read-only memory (ROM) emulation. For a high volume SoC, a processor may execute code out of a mask ROM. In order to make changes to the code within the ROM, a new mask has to be created, which is a very expensive and time-consuming process. During development, therefore, a block of memory may be used for ROM emulation.

Even if the ROM (such as flash memory) used for an application is programmable, SRAM may still provide a benefit over the ROM during development time. For example, the number of writes that a flash memory can sustain is limited. A large number of changes could be made to data stored in the SRAM without danger of the lifetime of the SRAM being exceeded. In addition, erasing data and writing data to the SRAM may be much quicker than writing data to a programmable ROM, such as flash memory.

During design, the size of SRAMs may be set based upon the maximum size of data they may need to store. This avoids expensive changes in layout and floor plan should the size of an SRAM need to be increased due to changing design considerations. In order to have enough SRAM for the functions listed above and any other required functions, much of the resulting SRAM space may be inefficiently used at various points in the design cycle and in use after production.

Any unused SRAM space increases the cost of the resulting system on chip, and has a direct result on cost of the product within which the system on chip will be located. By making SRAM blocks reconfigurable, SRAM usage can be made more efficient, which may increase performance and/or speed the development process. Alternatively, the total amount of SRAM may be reduced, because the remaining SRAM can be used more efficiently.

Figure 2:
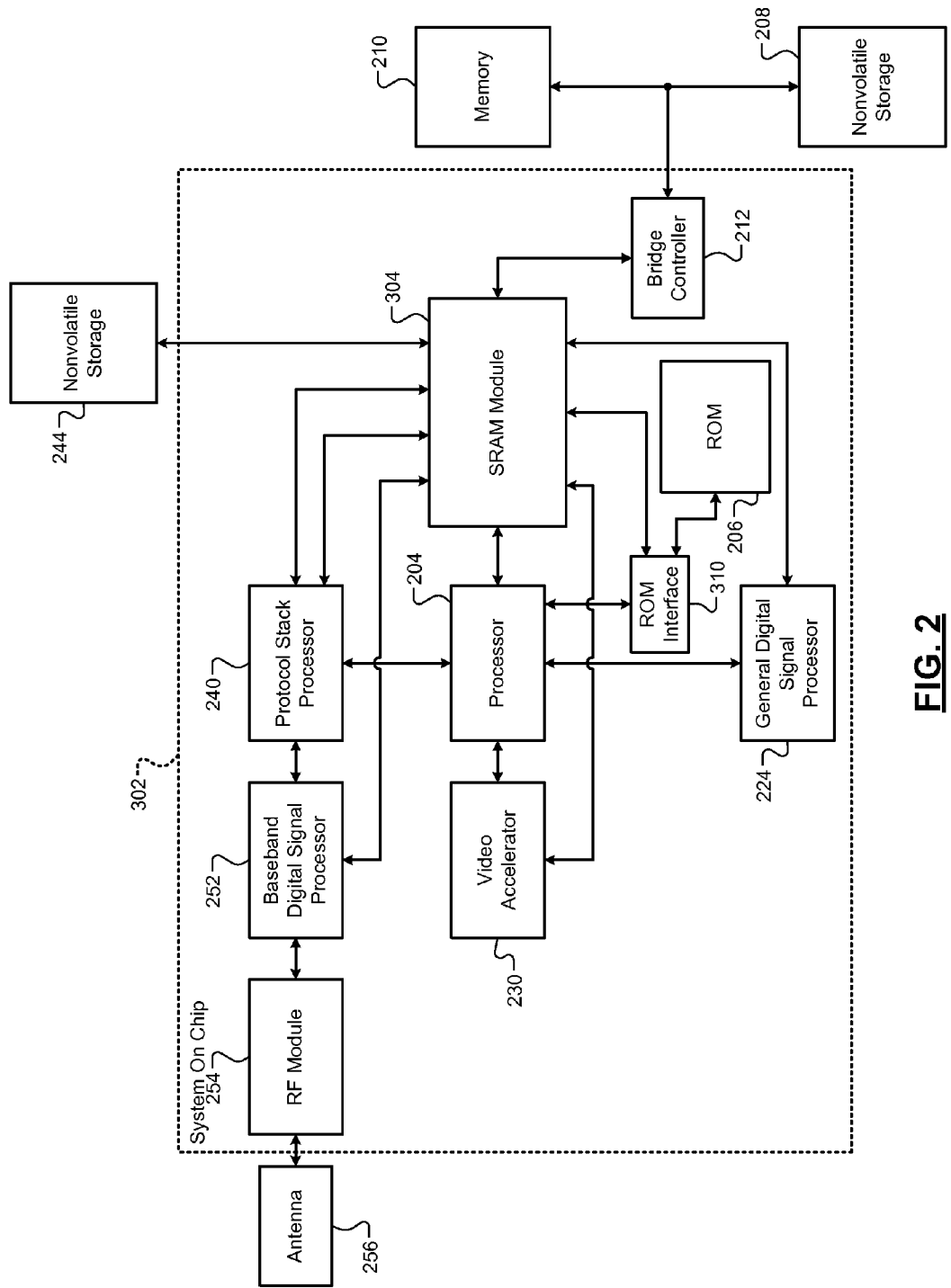
FIG. 2 is a functional block diagram of an exemplary SoC including a reconfigurable SRAM module according to the present disclosure.
Figure 3A:
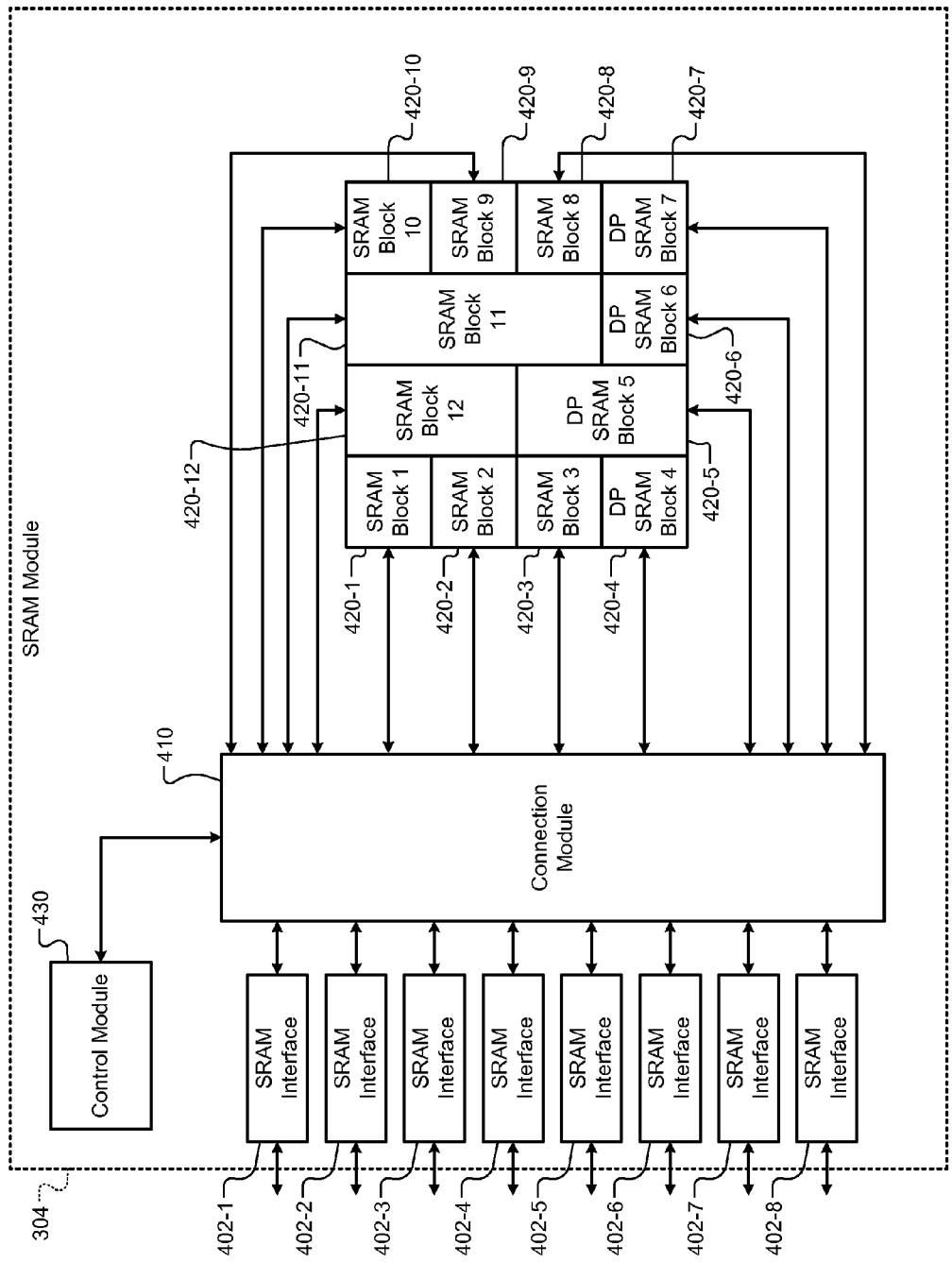
FIG. 3A is a functional block diagram of an exemplary implementation of the SRAM module according to the present disclosure.
Figure 3B:
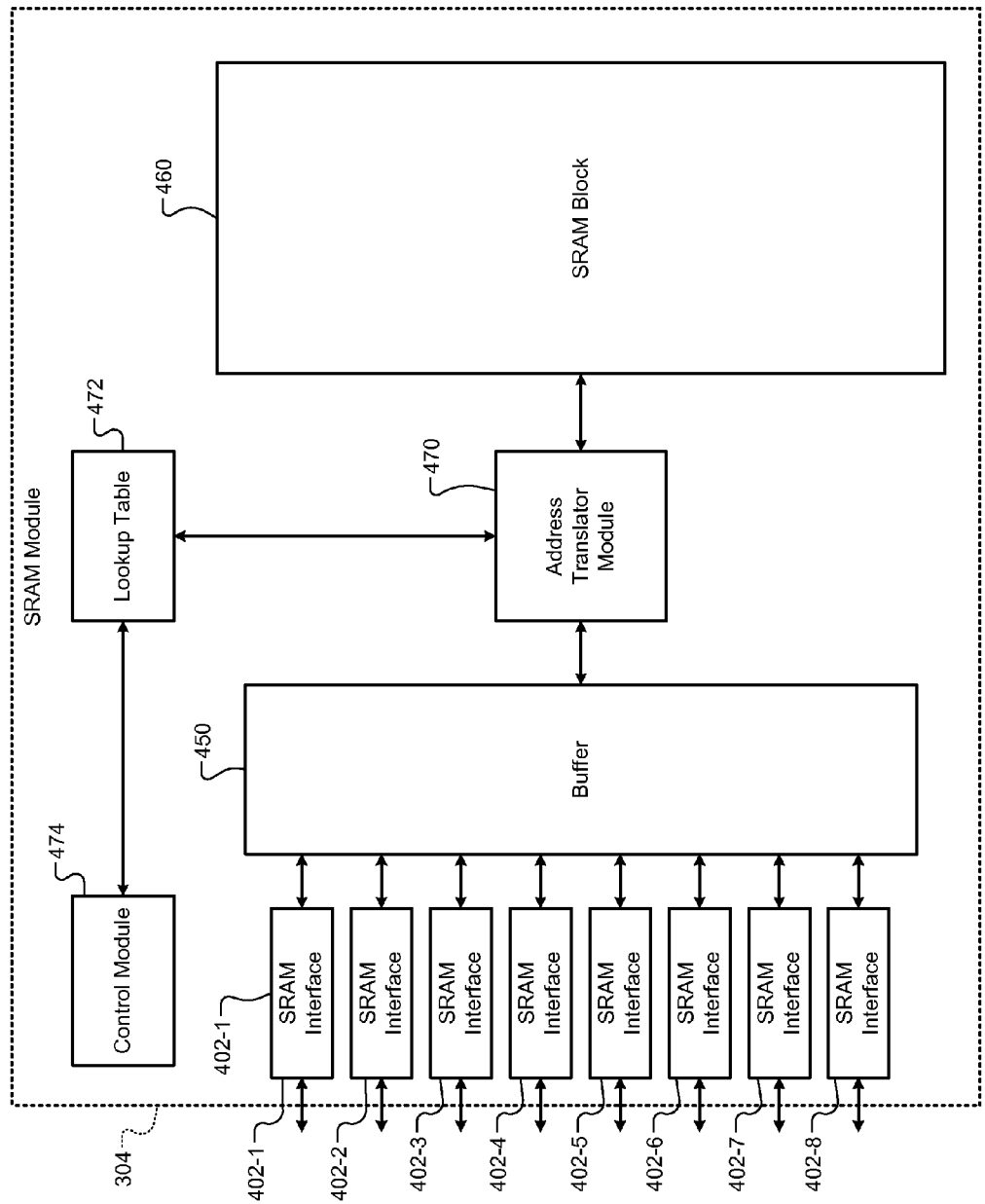
FIG. 3B is a functional block diagram of another exemplary implementation of the SRAM module according to the present disclosure.
Figure 4:
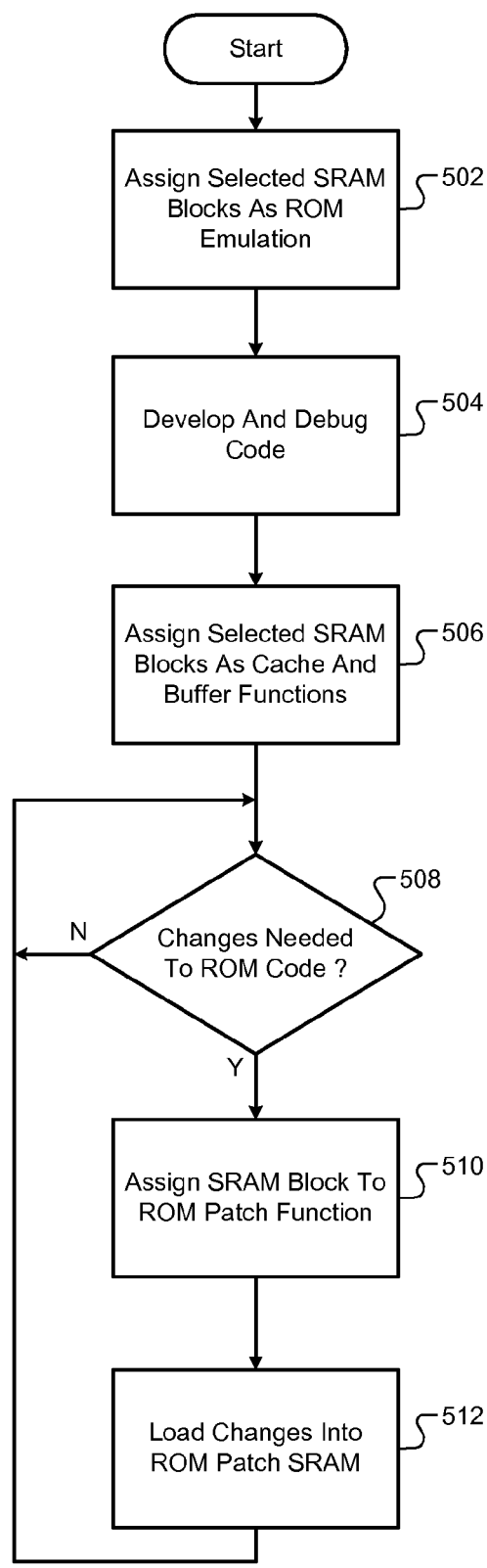
FIG. 4 is a flowchart depicting exemplary operation of a control module within an SRAM module according to the present disclosure.
Figure 5B:
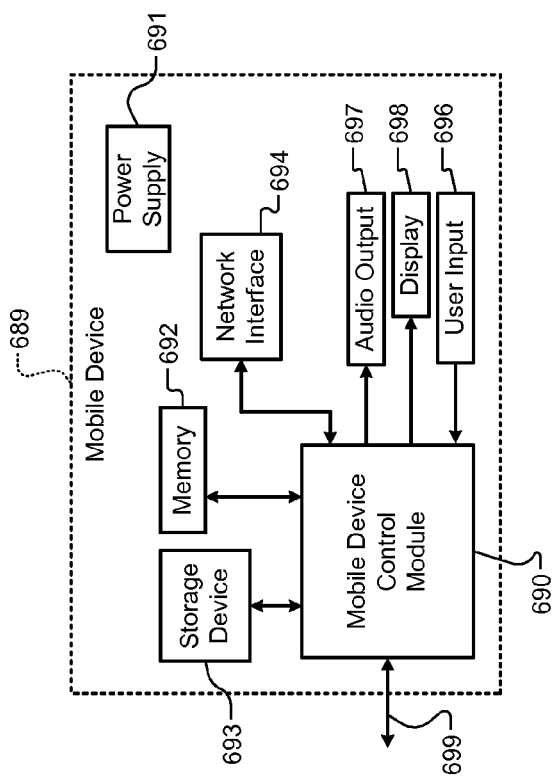
FIG. 5B is a functional block diagram of a mobile device according to the present disclosure.
Figure 5A:
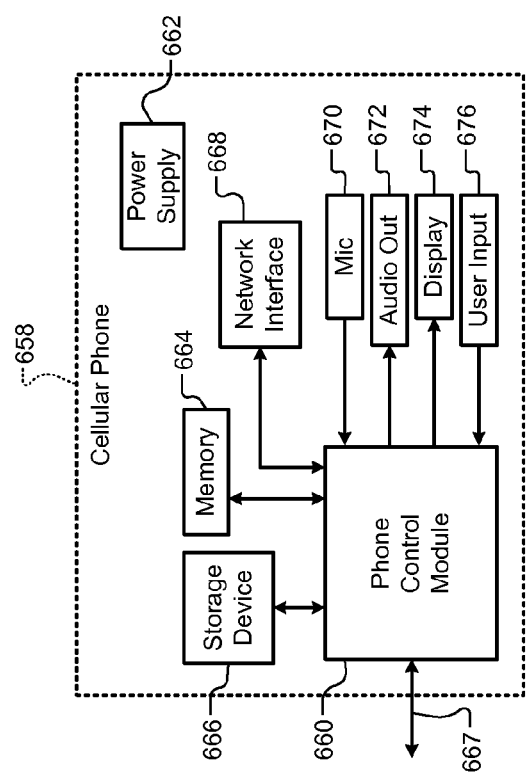
FIG. 5A is a functional block diagram of a cellular phone according to the present disclosure.

In brief, FIG. 2 is an exemplary implementation of the system of FIG. 1 according to the principles of the present disclosure. A single reconfigurable SRAM module or multiple reconfigurable SRAM modules includes multiple SRAM blocks that can be reassigned as needed during operation. FIGS. 3A and 3B depict exemplary implementations of a reconfigurable SRAM module. FIG. 4 is an exemplary flowchart of reconfiguration of the SRAM module during the development cycle, and FIGS. 5A and 5B are exemplary applications for a SoC according to the principles of the present disclosure.

Referring now to FIG. 2, a functional block diagram of a system on chip (SoC) 302 including a reconfigurable SRAM module 304 according to the present disclosure is shown. The components of the SoC 302 may be similar to those of the SoC 202 of FIG. 1. The SoC 302 is shown with all of the SRAMs consolidated into a single SRAM module 304. In various implementations, some SRAMs may remain independent, as shown in FIG. 1, while others are consolidated into the SRAM module 304.

Each component of the SoC 302 that desires to use SRAM communicates with the SRAM module 304. Interfaces may be introduced that provide some data from the SRAM module 304 and other data from another source of storage. For example, a ROM interface 310 may provide certain data from the ROM 206, while data associated with certain specified addresses are retrieved from the SRAM module 304. The ROM interface 310 can therefore programmatically replace sections of the ROM 206 with data from the SRAM module 304 depending on the application, where, for example, the section of the ROM 206 may be incorrect, out of date, or need to be replaced. For example, a block of SRAM in the SRAM module 304 can be used to emulate a section of the ROM 206 without the need to reprogram the ROM 206 or fabricate a new SoC 302.

Referring now to FIG. 3A, a functional block diagram of an exemplary implementation of the SRAM module 304 is shown. The SRAM module 304 includes an SRAM interface 402 for each of the elements of FIG. 2 that will access SRAM. For example, the first SRAM interface 402-1 may interface with the protocol stack processor 240, while the SRAM interface 402-2 may interface with the processor 204, and so on. A connection module 410 selectively connects or assigns each of the SRAM interfaces 402 to one or more SRAM blocks 420 on a dynamic basis. The number of SRAM blocks 420 to be connected to each SRAM interface 402 may vary depending on the particular function or component.

The SRAM blocks 420 may be equally sized or may have different sizes, as shown in FIG. 3A. For example only, the SRAM block 420-12 may be twice the size of the SRAM block 420-1, while the size of the SRAM block 420-11 is three times the size of the SRAM block 420-1. In addition, some or all of the SRAM blocks 420 may be dual ported. For example, the SRAM blocks 420-4, 420-5, 420-6, and 420-7 are shown in FIG. 3A as being dual ported.

The connection module 410 may connect one port of a dual ported SRAM block to one SRAM interface 402 and may connect the other port to another SRAM interface 402. For example, the connection module 410 may connect one port of the dual ported SRAM block 420-4 to nonvolatile storage 244, while connecting the other port of the dual ported SRAM block 420-4 to the protocol stack processor 240. In this way, the dual ported SRAM block 420-4 can be used as an L1 cache and accessed by both nonvolatile storage 244 and the protocol stack processor 240.

Multiple SRAM blocks 420 may be connected to the same SRAM interface 402 to increase the amount of memory available for that function. The connection module 410 may include a decoder (not shown) for each of the SRAM interfaces 402. The decoder may allow addresses from one of the SRAM interfaces 402 to be applied to any one of the SRAM blocks 420. The decoder may assign addresses from a single SRAM interface 402 to various ones of the SRAM blocks 420.

The connection module 410 may include pass transistor logic that connects inputs and outputs of ones of the SRAM blocks 420 to one of the SRAM interfaces 402. Elements of the connection module 410 may be implemented as a field programmable gate array (FPGA). A control module 430 controls operation of the connection module 410. The control module 430 may be programmed by control registers to determine to which SRAM interface 402 each of the SRAM blocks 420 is allocated. When the allocated SRAM blocks 420 are no longer needed, the connection module 410 may reconfigure such blocks and assign them to one or more SRAM interfaces 402.

Referring now to FIG. 3B, a functional block diagram of another exemplary implementation of the SRAM module 304 is shown. The SRAM interfaces 402 connect to a buffer 450. The buffer 450 may buffer access requests from each of the SRAM interfaces 402. Each request received from the SRAM interfaces 402 may be put into a queue that will then be sequentially used to access an SRAM block 460. The buffer 450 may tag each access with the identity of the SRAM interface 402 requesting the access.

An address translator module 470 may then translate the request received from the buffer 450 into an area of the SRAM block 460 based upon which the SRAM interface 402 requested the access. This translation may be performed based upon a lookup table 472. The lookup table 472 may be programmed by a control module 474. The lookup table 472 may specify how large an area of the SRAM block 460 corresponds to each of the SRAM interfaces 402 and at what offset within the SRAM block 460 the storage allocated to the SRAM interface 402 begins.

Referring now to FIG. 4, a flowchart depicts exemplary operation of a control module within an SRAM module according to the principles of the present disclosure. Control begins in step 502, where a group of SRAM blocks are assigned to provide ROM emulation. These selected SRAM blocks are assigned based on a first assignment. For example only, the first assignment can be used to store code and data as the system on chip (SoC) is being developed. Control continues in step 504, where code that is stored in the selected SRAM blocks is developed and debugged.

Control continues in step 506, where once development and debugging is done, the selected SRAM blocks are assigned based on a second assignment. For example only, the second assignment can assign the blocks to cache and buffering functions. The selected SRAM blocks can be reassigned as scratch pad SRAM, level 1 cache, level 2 cache, etc. This allows the end user to decide whether the SRAM is more beneficially used as a scratch pad SRAM or as a general purpose processor cache. Initially assigning SRAM blocks to ROM emulation allows code development to proceed smoothly while only temporarily sacrificing processor performance.

When development is complete, the SRAM blocks can be reassigned to serve as processor caches, such as the level 2 cache. In addition, the sizes of each SRAM may be set in step 506 based upon the application for which the SoC is intended. The techniques described herein may allow the total size of SRAM on the SoC to be reduced, such as by a factor of two. This reduction in size translates directly into a cost savings. In addition, a smaller SRAM will have a lower overall leakage current.

Control continues in step 508, where control determines whether changes are needed to the ROM code. If so, control transfers to step 510; otherwise, control remains in step 508. In step 510, control can generate a third assignment. For example only, the third assignment may assign one or more SRAM blocks as a ROM patch function. Control continues in step 512, where changed code and/or data is loaded into the newly assigned patch ROM SRAM blocks.

A ROM interface, such as the ROM interface 310 in FIG. 2, may be updated to look to the ROM patch SRAM for certain address ranges instead of to the ROM. Control then returns to step 508. While the SoC is in operation, assignments of the SRAM blocks may be dynamically allocated based upon the use model of the SoC. In addition, if an error is detected in one area of SRAM, another block of SRAM can be reassigned to the function previously served by the malfunctioning SRAM.

Referring now to FIGS. 5A-5B, various exemplary implementations incorporating the teachings of the present disclosure are shown. Referring now to FIG. 5A, the teachings of the disclosure can be implemented in a phone control module 660 of a cellular phone 658. The cellular phone 658 includes the phone control module 660, a power supply 662, memory 664, a storage device 666, and a cellular network interface 667. The cellular phone 658 may include a network interface 668, a microphone 670, an audio output 672 such as a speaker and/or output jack, a display 674, and a user input device 676 such as a keypad and/or pointing device. If the network interface 668 includes a wireless local area network interface, an antenna (not shown) may be included.

The phone control module 660 may receive input signals from the cellular network interface 667, the network interface 668, the microphone 670, and/or the user input device 676. The phone control module 660 may process signals, including encoding, decoding, filtering, and/or formatting, and generate output signals. The output signals may be communicated to one or more of memory 664, the storage device 666, the cellular network interface 667, the network interface 668, and the audio output 672.

Memory 664 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 666 may include an optical storage drive, such as a DVD drive, and/or a hard disk drive (HDD). The power supply 662 provides power to the components of the cellular phone 658.

Referring now to FIG. 5B, the teachings of the disclosure can be implemented in a control module 690 of a mobile device 689. The mobile device 689 may include the control module 690, a power supply 691, memory 692, a storage device 693, a network interface 694, and an external interface 699. If the network interface 694 includes a wireless local area network interface, an antenna (not shown) may be included.

The control module 690 may receive input signals from the network interface 694 and/or the external interface 699. The external interface 699 may include USB, infrared, and/or Ethernet. The input signals may include compressed audio and/or video, and may be compliant with the MP3 format.

Additionally, the control module 690 may receive input from a user input 696 such as a keypad, touchpad, or individual buttons. The control module 690 may process input signals, including encoding, decoding, filtering, and/or formatting, and generate output signals.

The control module 690 may output audio signals to an audio output 697 and video signals to a display 698. The audio output 697 may include a speaker and/or an output jack. The display 698 may present a graphical user interface, which may include menus, icons, etc. The power supply 691 provides power to the components of the mobile device 689. Memory 692 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 693 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system on chip comprising:
    a volatile random access memory;
    a read-only memory; and
    a processor configured to, during a development phase of the system on chip, read program code from the volatile random access memory and execute the program code, wherein the program code is developed during the development phase until a completed version of the program code is reached,
    wherein the processor is configured to, during an operational phase of the system on chip subsequent to the development phase, (i) read the completed version of the program code from the read-only memory, (ii) execute the completed version of the program code, and (iii) cache data in the volatile random access memory, and
    wherein the processor is configured to, during the operational phase and in response to an improvement to the completed version of the program code being developed, (i) read program code corresponding to the improvement from the volatile random access memory, and (ii) read remaining portions of the completed version of the program code from the read-only memory.

2. The system on chip of claim 1, further comprising a read-only memory interface configured to provide data to the processor from the read-only memory and the volatile random access memory.

3. The system on chip of claim 2, wherein the read-only memory interface is configured to, during the development phase, provide the program code from the volatile random access memory to the processor.

4. The system on chip of claim 3, wherein the read-only memory interface is configured to, during the operational phase, provide the completed version of the program code from the read-only memory to the processor.

5. The system on chip of claim 4, wherein the read-only memory interface is configured to, during the operational phase and in response to the improvement to the completed version of the program code being developed, (i) provide program code corresponding to the improvement from the volatile random access memory to the processor, and (ii) provide remaining portions of the completed version of the program code from the read-only memory to the processor.

6. The system on chip of claim 2, further comprising a connection module configured to, according to a specified assignment, dynamically create electrical connectivity between the volatile random access memory and one or more electrical components of the system on chip, wherein the electrical components include the read-only memory interface and the processor.

7. The system on chip of claim 6, wherein:
    the specified assignment during the development phase instructs the connection module to create electrical connectivity between the volatile random access memory and the read-only memory interface, and
    the specified assignment during the operational phase instructs the connection module to create electrical connectivity between the volatile random access memory and the processor.

8. The system on chip of claim 6, wherein:
    the volatile random access memory comprises a plurality of discrete blocks of memory, and
    the connection module is configured to, according to the specified assignment, dynamically create electrical connectivity between, for each one of the plurality of discrete blocks of memory, the discrete block of memory and a selected one of the electrical components.

9. The system on chip of claim 8, wherein the specified assignment is adjusted, in response to the improvement to the completed version of the program code being developed, to dynamically create electrical connectivity between at least one of the plurality of discrete blocks of memory and the read-only memory interface.

10. The system on chip of claim 1, wherein the volatile random access memory comprises static volatile random access memory.

11. The system on chip of claim 1, wherein the read-only memory comprises mask read-only memory.

12. The system on chip of claim 1, wherein the read-only memory comprises programmable read-only memory.

13. The system on chip of claim 12, wherein the read-only memory comprises flash memory.

14. The system on chip of claim 1, wherein the processor is a digital signal processor (DSP).

15. A method of operating a system on chip, the method comprising:
    during a development phase of the system on chip, reading program code from a volatile random access memory for execution by a processor, wherein the program code is developed during the development phase until a completed version of the program code is reached;
    during an operational phase of the system on chip subsequent to the development phase, (i) reading the completed version of the program code from a read-only memory for execution by the processor, and (ii) caching data in the volatile random access memory; and
    during the operational phase and in response to an improvement to the completed version of the program code being developed, (i) reading program code corresponding to the improvement from the volatile random access memory for execution by the processor, and (ii)

reading remaining portions of the completed version of the program code from the read-only memory for execution by the processor.

16. The method of claim 15, further comprising providing data to the processor from the read-only memory and the volatile random access memory using a read-only memory interface.

17. The method of claim 16, further comprising:
during the development phase, providing the program code from the volatile random access memory to the processor using the read-only memory interface; and
during the operational phase, providing the completed version of the program code from the read-only memory to the processor using the read-only memory interface.

18. The method of claim 17, further comprising, during the operational phase and in response to the improvement to the completed version of the program code being developed, (i) providing program code corresponding to the improvement from the volatile random access memory to the processor using the read-only memory interface, and (ii) providing remaining portions of the completed version of the program code from the read-only memory to the processor using the read-only memory interface.

19. The method of claim 16, further comprising, according to a specified assignment, dynamically creating electrical connectivity between the volatile random access memory and one or more electrical components of the system on chip, wherein the electrical components include the read-only memory interface and the processor.

20. The method of claim 19, further comprising:
setting the specified assignment during the development phase to create electrical connectivity between the volatile random access memory and the read-only memory interface; and
setting the specified assignment during the operational phase to create electrical connectivity between the volatile random access memory and the processor.

21. The method of claim 19, wherein:
the volatile random access memory comprises a plurality of discrete blocks of memory, and
the method further comprises, according to the specified assignment, dynamically creating electrical connectivity between, for each one of the plurality of discrete blocks of memory, the discrete block of memory and a selected one of the electrical components.

22. The method of claim 21, further comprising, in response to the improvement to the completed version of the program code being developed, adjusting the specified assignment to dynamically create electrical connectivity between at least one of the plurality of discrete blocks of memory and the read-only memory interface.

* * * * *